(12) United States Patent
Uppal et al.

(10) Patent No.: US 6,709,885 B2
(45) Date of Patent: Mar. 23, 2004

(54) METHOD OF FABRICATING IMAGE SENSORS USING A THIN FILM PHOTODIODE ABOVE ACTIVE CMOS CIRCUITRY

(75) Inventors: Jack S. Uppal, San Jose, CA (US); David B. Fraser, Danville, CA (US); Stephen Bradford Gospe, Sunnyvale, CA (US); Kevin M. Connolly, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/280,253

(22) Filed: Oct. 25, 2002

(65) Prior Publication Data

US 2003/0057357 A1 Mar. 27, 2003

Related U.S. Application Data

(62) Division of application No. 09/474,177, filed on Dec. 29, 1999, now Pat. No. 6,501,065.

(51) Int. Cl.[7] ............................................... H01L 21/00
(52) U.S. Cl. ........................................... 438/59; 438/74
(58) Field of Search ............................. 438/59, 69, 74; 250/214.1, 208.1

(56) References Cited

U.S. PATENT DOCUMENTS

| | | |
|---|---|---|
| 4,894,700 A * | 1/1990 | Nabue et al. ................. 357/30 |
| 5,073,010 A | 12/1991 | Johnson et al. |
| 5,576,763 A | 11/1996 | Ackland et al. |
| 5,625,210 A | 4/1997 | Lee et al. |
| 5,712,504 A | 1/1998 | Yano et al. |
| 5,835,141 A | 11/1998 | Ackland et al. |
| 5,841,159 A | 11/1998 | Lee et al. |
| 5,923,071 A | 7/1999 | Saito |
| 5,998,794 A * | 12/1999 | Spivey et al. .......... 250/370.09 |

OTHER PUBLICATIONS

Bohm, M. "Intelligent Image Sensor Systems in TFA (Thin Film on ASIC) Technology," Special Course on Intelligent Sensors, University of Roorkee, Roorkee, U.P., India, Oct. 28–29, 1994.

Powell et al., "Amorphous Silicon Photodiode–Thin Film Transistor Image Sensor With Diode On Top Structure", Mat. Res. Soc. Proc. vol. 467 1997, pp. 863–868.

Schneider, B. et al., "Hybrid Design Targets Advanced Imaging Needs", Laser Focus World, Jul. 1998, pp. 99–104.

Stiebig, H. et al. "Simulation of a–Si:H Color Sensors for Application In Intelligent Sensor Systems", Mat. Res. Soc. Symp. Proc. vol. 297, pp. 963–968.

Street, R.A., "Amorphous Silicon Electronics," Mat. Res. Soc MRS Bulletin, vol. XV11, No. 11, Nov. 1992, pp. 70–76.

Street, R.A. et al. "Page Sized A–Si: H 2–Dimensional Imaging Arrays" Mat. Res. Soc. Symp. Proc. vol. 297 1993 pp. 957–962.

* cited by examiner

Primary Examiner—John F. Niebling
Assistant Examiner—Viktor Simkovic
(74) Attorney, Agent, or Firm—Blakely, Sokoloff, Taylor & Zafman LLP (57) ABSTRACT

A method of fabricating an image sensor having pin photodiodes residing vertically atop underlying CMOS control circuitry. In the preferred technique, pin photodiodes fabricated in amorphous silicon are utilized.

16 Claims, 5 Drawing Sheets

METHOD OF FABRICATING IMAGE SENSORS USING A THIN FILM PHOTODIODE ABOVE ACTIVE CMOS CIRCUITRY

CROSS REFERENCE TO RELATED APPLICATION

This application is a divisional of application Ser. No. 09/474,177 filed Dec. 29, 1999 now U.S. Pat. No. 6,501,065 entitled "Method of Fabricating Image Sensors Using A Thin Film Photodiode Above Active CMOS Circuitry."

FIELD OF THE INVENTION

The present invention relates to the field of image sensing and more specifically to a vertically integrated complementary metal oxide semiconductor (CMOS) image sensor.

BACKGROUND OF THE INVENTION

Solid state image sensors, which are used in applications such as digital cameras, are currently available in numerous forms. Charge coupled devices (CCD) and CMOS image sensors, for example, are based on a two dimensional array of pixels. Each pixel contains a light sensing device that is capable of converting an optical image into an electronic signal. When photons strike the photoactive region of the array, free charge carriers are generated in an amount that is linearly proportional to the incident photon radiation. The photon generated charge carriers are collected and moved to output circuitry for processing. The pixels are typically disposed in rows and columns to form the array. The number of pixels in the array determines the resolution of the final image produced by the sensors. Arrays of 640×480 are used for low-cost digital cameras and high-end digital cameras have a resolution of at least 1,000×800.

Recent developments in electronic imaging have created the need for image sensors with improved performance and additional functions. Some of these applications require a high dynamic range and on-chip signal processing. Conventional CCDs are unable to achieve these goals due to their limited dynamic range, serial readout mode, and pixels that can only perform limited "intelligent" operations. Furthermore, the serial read out scheme for CCDs precludes random access to individual pixels, so that the image processing is limited to the entire image.

To overcome the problems inherent in CCDs, laterally integrated CMOS sensors have been developed using CMOS circuitry in each pixel and photodiodes for the light sensing devices. CMOS image sensors have numerous advantages over conventional CCDs. They scale better than CCDs because as the CMOS process technology evolves, more complex circuitry can be added to each pixel. The additional circuitry increases sensitivity and reduces noise, allowing the pixel to shrink while maintaining the same functionality. CMOS sensors also have a cost advantage over CCDs because they can take advantage of the CMOS fabrication process. The cost of CMOS image sensors is further reduced because the CMOS process is much less complex than the CCD process. Since the CMOS process is less complex, the yield of CMOS image sensor is typically higher. This is partially due to the fact that the sensor does not use a serial read out process, so a defect in the chip will only affect a single pixel.

Typical prior art CMOS image sensors in use rely on a lateral integration of the photodetector and the pixel electronics. While laterally integrated CMOS sensors overcome some of the limitations of CCDs, they also suffer from some disadvantages. In a laterally integrated CMOS image sensor, the photodetector and the CMOS circuitry are fabricated next to each other on the silicon substrate. Thus, additional lateral area ("real estate") is required for the lateral integration of the photodetector with the CMOS circuitry. This can reduce the area fill factor and limit the possible resolution. Furthermore, it is difficult to optimize the process technology for both the CMOS transistor and for the photodiode at the same time. So, while the design of fast CMOS circuits demands the use of shallow junctions with very low sheet resistance, this is totally inconsistent with using these junctions as a photodiode. Also, when additional on-chip functions are added to the sensors, either the pixel size will increase to maintain the sensitivity of the sensor or the area required for the photodiode will decrease to maintain the pixel size. If the pixel size increases to maintain the sensitivity, the resolution of the sensor will decrease. If the photodiode area decreases to maintain the pixel size, the sensitivity of the sensor may decrease.

Accordingly, the present invention pertains to the integration of photodetectors with CMOS circuitry.

DETAILED DESCRIPTION OF THE INVENTION

Referring to FIGS. 1–6, an image sensor 10, fabricated by vertically integrating a photodiode above active complementary metal oxide semiconductor (CMOS) circuitry, is shown in accordance with one embodiment of the present invention. Although described with reference to certain specific embodiments, those skilled in the art will recognize that the present invention may be practiced in other embodiments as well. Throughout this detailed description, numerous specific details are set forth regarding photodiodes, CMOS image sensors, film materials and film patterning techniques. However, many of these details are provided as examples in order to describe the invention.

Figure 1:
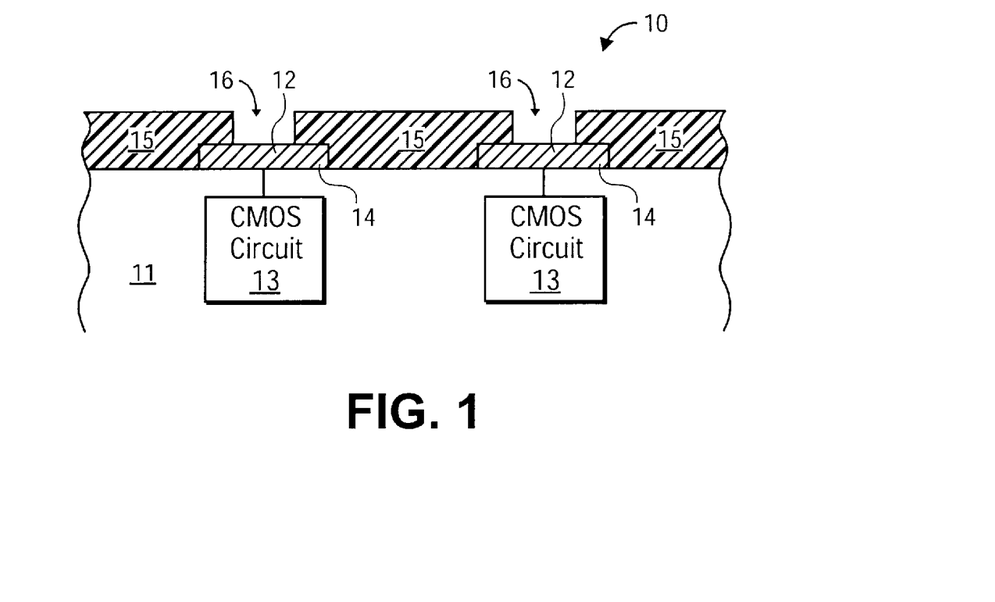
FIG. 1 is a cross-sectional diagram showing a start of a formation of a pin photodiode structure vertically atop underlying CMOS control circuitry for an image sensor of the present invention.

The present invention avoids many of the problems inherent in a prior art laterally integrated CMOS image sensor by forming a light sensing device (photodiodes in the preferred technique) vertically above the CMOS circuitry. FIG. 1 illustrates a cross-sectional view of an integrated circuit structure 11, having a penultimate metal layer 12 residing above other layers which form the various underlying CMOS circuitry 13. In the example illustration, only two such CMOS circuits 13 are shown. The metal layer 12 provides the uppermost (or penultimate) conductive layer (metal is described in the example) for the underlying CMOS circuitry 13, so that each conductive region 14 shown corresponds with its underlying circuitry 13.

It is appreciated that each region 14 of layer 12 resides vertically above its corresponding CMOS circuitry 13, so that each region 14 is utilized as a foundation for the forming of the photodiodes for each pixel of the image sensor 10. Although shown and described as a metal, it is appreciated that the layer 12 can be formed from a variety of conductive materials, including metals, alloys, and silicides. Furthermore, layer 12 may be comprised of more than one material or material layer. Thus, it is typical practice in semiconductor device manufacturing to utilize barrier metals, such as tungsten, titanium, tantalum (as well as their nitrides), to form a secondary conductive layer over a primary conductive layer (such as aluminum or copper). The CMOS circuitry 13 is the control circuitry associated with each image sensing pixel and as such, a variety of different circuit implementations can be practiced. The CMOS circuitry 13 is fabricated using a known CMOS process.

Subsequently, as shown in FIG. 1, a dielectric layer 15 is formed above the structure 11 and openings (generally referred to as vias) 16 are formed to expose portions of the conductive regions 14. A separate opening 16 is formed for each region 14. Any of a variety of known dielectric materials can be used for the dielectric layer 15. Typically in silicon semiconductor fabrication of CMOS circuits, oxides (such as $SiO_2$), nitrides and low-k dielectrics are utilized between the conductive layers.

Alternatively, no dielectric or via is needed if a damascene (including dual-damascene) process is used to deposit and pattern the bottom electrode of the photodiode. For example, a damascene process comprises patterning a trench in the underlying dielectric film, depositing a thick layer of metal and, then, polishing the metal back until the metal remains only in the previously etched trench. This results in a structure where the top of the metal electrode is exposed, with dielectric around the metal electrode in a planar structure.

Figure 2:
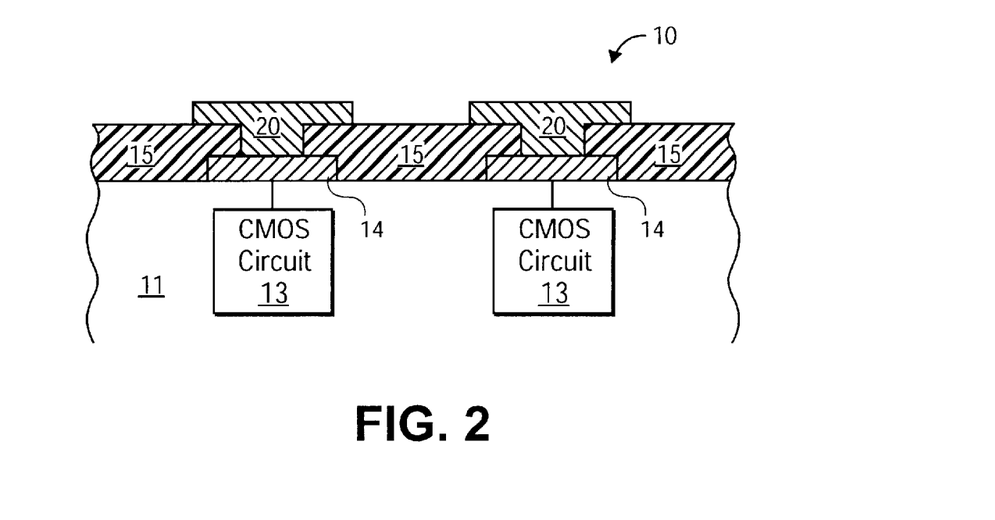
FIG. 2 is a cross-sectional diagram showing a formation of a lower contact conductor of the photodiode atop a penultimate conductive layer of the CMOS circuitry as well as over a dielectric material.

Then, as shown in FIG. 2, a conductive material for forming a first or bottom contact conductor 20 of a photodiode is deposited and patterned using a known photolithograpic technique. The resulting pattern fills in the openings 16, as well as forming a region above the dielectric layer 15 and overlying the conductive region 14. A variety of conductive films can be used to form the conductive layer 20. However, in the preferred technique, n-doped amorphous silicon is utilized for the layer 20. In typical practice, amorphous silicon is deposited by a chemical vapor deposition technique, specifically by plasma-enhanced chemical vapor deposition (PECVD). For example, amorphous silicon can be deposited from silane gas ($SiH_4$) by using PECVD, then patterned and etched. The bottom conductor 20 is formed so that each of the regions 14 are separated from each other to form separate pixels for the image sensor 10.

Figure 3:
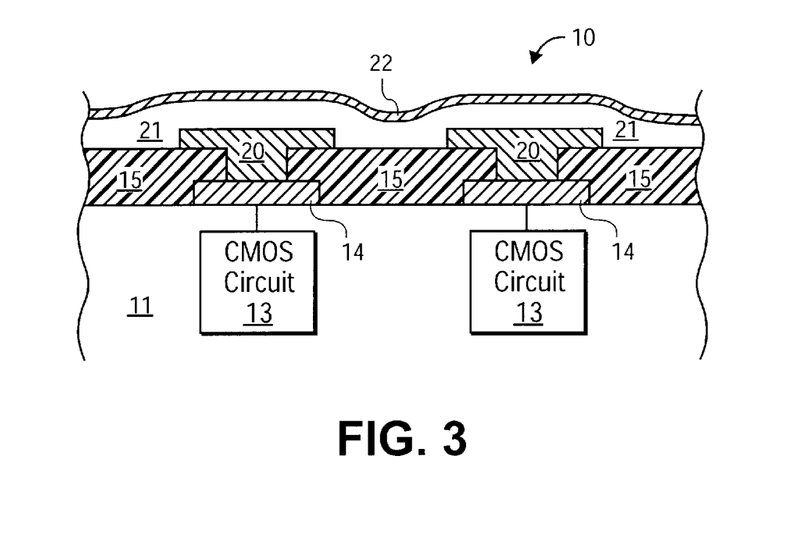
FIG. 3 is a cross-sectional diagram showing a formation of subsequent layers of the photodiode atop the lower contact conductor.

Next, in FIG. 3, an intrinsic layer 21 is deposited, followed by a deposition of a second or top contact conductor 22 for the photodiode. In the particular embodiment, intrinsic amorphous silicon is deposited for layer 21, followed by a p-doped amorphous silicon 22. Essentially, a continuous deposition process of intrinsic amorphous silicon is initiated to form the layer 21 and the process is concluded by introducing a p-dopant to the flow. This results in the deposition of the two layers 21 and 22 in a continuous process.

Figure 4:
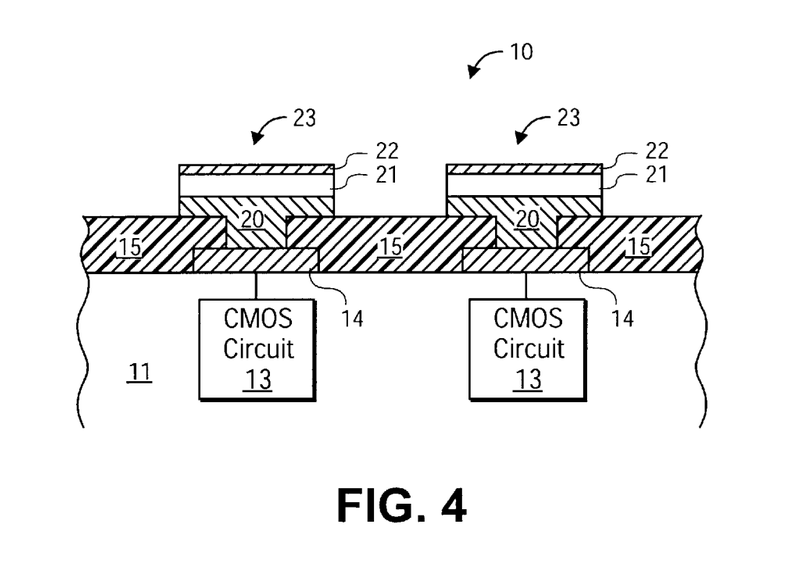
FIG. 4 is a cross-sectional diagram showing a patterning and etching of the layers shown in FIG. 3 to form a stacked pin photodiode.

Then, the two layers 21, 22 are patterned and etched to form the structure shown in FIG. 4. The p-i-n layers formed from the formation of the n-doped amorphous silicon bottom conductor 20, intrinsic (i) amorphous silicon 21 and the p-doped amorphous silicon top conductor, form a p-i-n p-i-n junction (referred to as pin) photodiode 23. As noted in FIG. 4, a separate photodiode 23 is formed atop each region 14. In the example embodiment, the light sensing device is the amorphous silicon photodiode. As noted above, amorphous silicon is deposited from silane gas ($SiH_4$) by plasma-enhanced chemical vapor deposition (PECVD). The PECVD process allows the amorphous silicon film to be deposited on large areas at lower temperatures and lower costs. Amorphous silicon films are typically grown at 200–300° C., and directly deposited on silicon (such as layer 15), as well as on the metal material 12 of the CMOS control circuitry. These amorphous silicon films typically include a fairly large amount of hydrogen, which is a strong function of deposition rate and substrate temperature, to passivate dangling bonds in the amorphous film. In practice, there is a distinct trade-off encountered in trying to maximize atomic hydrogen content and high quality films with film deposition rates that are manufacturable.

It is appreciated that amorphous silicon is selected since it has standard semiconductor properties and superior optical properties. For example, amorphous silicon has a higher absorption coefficient than crystalline silicon, is highly photoconductive, and has a spectral sensitivity in the range of about 350 nm to 750 nm, which is close to that of the human eye. Hydrogen incorporated in the film reduces the number of dangling bonds in the amorphous silicon and, thus, reduces the trap density. The lower trap density results in lower leakage currents in the photodiode and directly to increased signal to noise in the photodiode.

Figure 5:
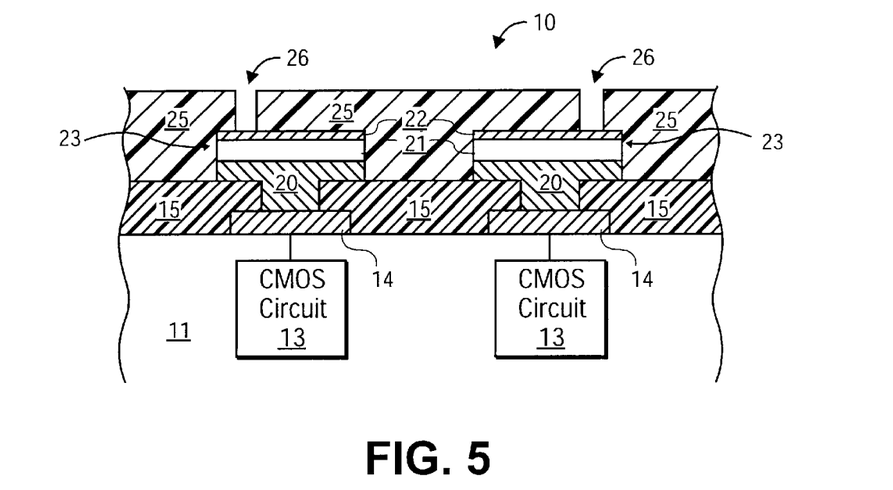
FIG. 5 is a cross-sectional diagram showing a formation of a dielectric layer above the photodiode.

Then, as shown in FIG. 5, a dielectric layer 25 (equivalent to layer 15) is deposited and openings 26 formed to expose a portion of the upper conductor 22 for each photodiode 23. Generally, it is preferred for the dielectric layer 25 to have good light transfer (transmissivity) property to allow light to pass through to reach the photodiode 23. Then, another conductive material is deposited to form a conductive line 27 to each of the photodiodes 23. The actual pattern for the conductive line or lines is a design choice and can be comprised of separate lines or just a single line to the photodiodes 23. The conductive layer 27 fills the openings 26 to electrically couple to the upper contact conductor 22 of the photodiode 23.

The material selected for the conductive layer 27 is determined by the performance characteristics desired. For example, conductive material which has poor light transmissivity can be used, but in that event, a portion of the photodiode 23 will need to be exposed for light reception (as shown by arrows 29). Thus, when metals such as Al and Cu are used for the conductive layer 27, it cannot completely overly the photodiode 23, since such metals would block light from reaching the photodiodes 23.

However, when conductive materials having good light transmissivity are utilized, the material can overly the photodiode 23 without the use of any dielectric between the photodiode and the conductive film. One example of a conductive material with good light transmissivity is indium tin oxide (ITO). When layer 27 is formed as an ITO layer, it allows light passage to the diode and also provides electrical connection to the top conductor 22 of the photodiode 23.

Figure 6:
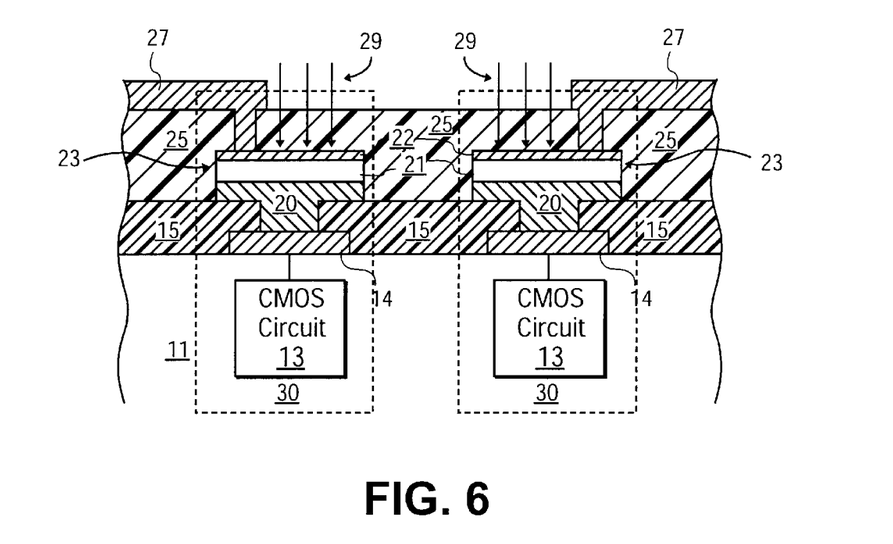
FIG. 6 is a cross-sectional diagram showing a formation of a second conductive layer to provide contact to the upper contact layer of the photodiode.

Thus, FIG. 6 shows a completed image sensor structure having the photodiodes overlying the CMOS controlling circuitry. Typically, the photodiodes are arranged in an array so that each photodiode 23 functions as a pixel (shown by the dotted line 30) for the sensor. In prevalent practice, the upper conductor of the photodiode 23 are coupled through the conductive layer 27 to a common point, such as ground. When light impinges on a particular photodiode 23, the diode conducts, causing an electrical connection between the underlying CMOS circuit 13 and the conductive line 27. Thus, when line 27 is coupled to ground, a leakage current flows from the contact point on the CMOS circuitry to ground. The actual contact point on to the CMOS circuitry by each region 14 is a design choice, based on the CMOS circuit implemented.

Figure 7:
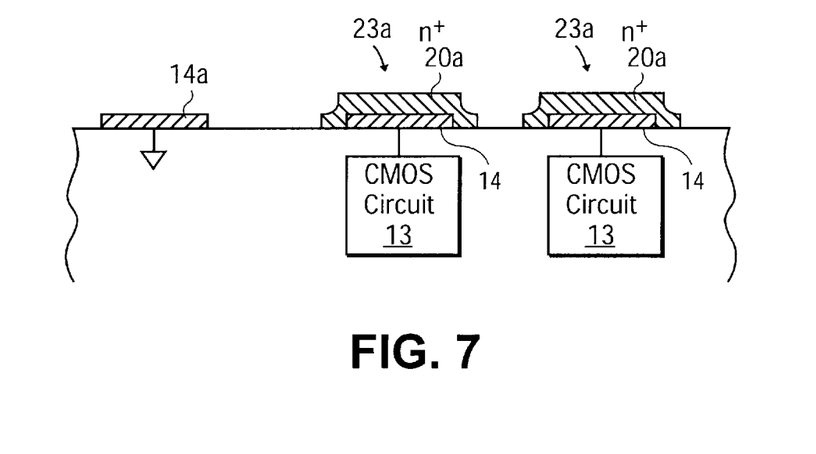
FIG. 7 is a cross-sectional diagram showing a start of a formation of an alternative pin photodiode structure vertically atop underlying CMOS control circuitry for an image sensor of the present invention, the structure having the lower contact conductor of the photodiode deposited over the CMOS circuitry.
Figure 8:
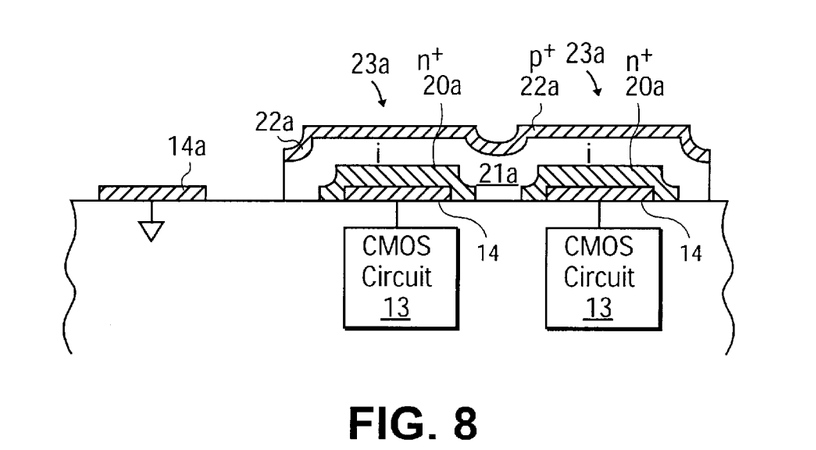
FIG. 8 is a cross-sectional diagram showing the formation of the subsequent layers for forming a stacked pin photodiode.
Figure 9:
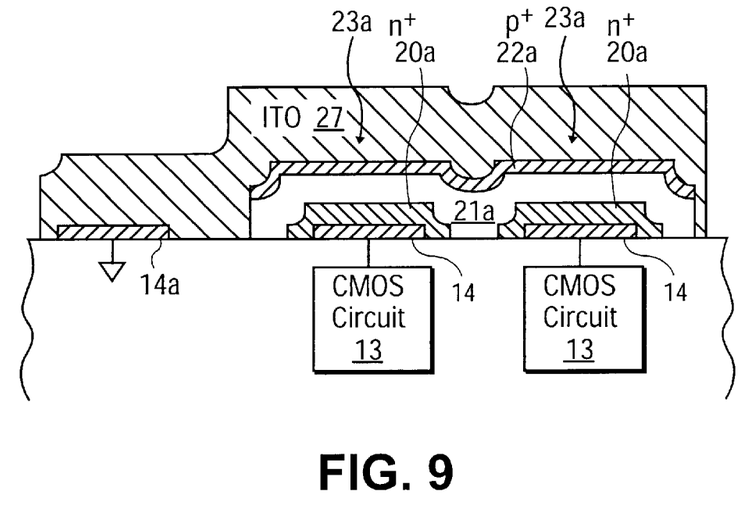
FIG. 9 is a cross-sectional diagram showing a formation of a second conductive layer to provide contact to the upper contact layer of the photodiode.

Referring to FIGS. 7–9, an alternative structure for forming the image sensor is shown. In FIG. 7, a conductive region 14 is again shown above the CMOS circuitry 13 (equivalent to the portion shown in FIG. 1). The regions 14 essentially form the penultimate metal layer for the CMOS circuitry 13. An equivalent region 14a is shown to the left and is designated separately in this example to show that this region 14a is coupled to a supply return, such as ground potential. The pixel area is exemplified by the two regions 14 to the right on the structure.

Instead of depositing a dielectric layer as in FIG. 1, an n-dopant is activated in the plasma flow to form the n-doped amorphous silicon, which is deposited directly, patterned and etched to form a conforming lower contact conductive layer 20a of the photodiode 23a. The photodiode 23a is equivalent to photodiode 23 in the materials used and the function performed.

Subsequently, intrinsic amorphous silicon 21a is deposited and at the conclusion of this deposition, the p-dopant is activated in the plasma flow to form the top p-doped amorphous silicon layer 22a. A photolithographic patterning and etching produces a structure shown in FIG. 8. As illustrated in FIG. 8, the photodiodes 23a are formed as the pin photodiodes above the metal regions 14 and correspond to the pixels of the image sensor. Although the intrinsic and p-doped regions are continuous, the separation of the n-doped regions produce separate pin photodiodes for each pixel region 30.

Next, the conductive line(s) 27 is deposited, as shown in FIG. 9. Although various conductive materials can be utilized to form the line(s) as noted previously, the preference is to use a conductive material with good light transmissivity. Therefore, the example shown in FIG. 8 uses a covering of ITO over the structure to form a continuous conductive top layer, which allows light to pass through to the photodiodes 23a. When the region 14a is coupled to ground potential, the ITO layer 27 couples the top conductor of the pin photodiode to ground. The photodiode and the image sensor of FIG. 8 then function equivalently to the earlier described embodiment of FIGS. 1–6.

It is appreciated that a variety of photodiodes can be constructed to perform the same function as the photodiodes 23,23a described above. One preferred pin photodiode for the embodiments described above is illustrated in FIG. 10. The p-i-n (or "pin") photodiode structure is comprised of the undoped or intrinsic i-type layer 21 (21a), which is much thicker than the doped n- and p-layers 20 (20a) and 22 (22a), respectively. Typically, amorphous silicon is doped with phosphorus to produce the n-doped layer 20 and boron to produce the p-doped layer 22. The n- and p-dopants are added in the plasma during plasma flow. The n- and p-doped layers 20, 22 are present to provide an electrical junction for the intrinsic material 21. The absorption of light takes place mainly in the intrinsic layer when the top p-layer is sufficiently thin.

Figure 10:
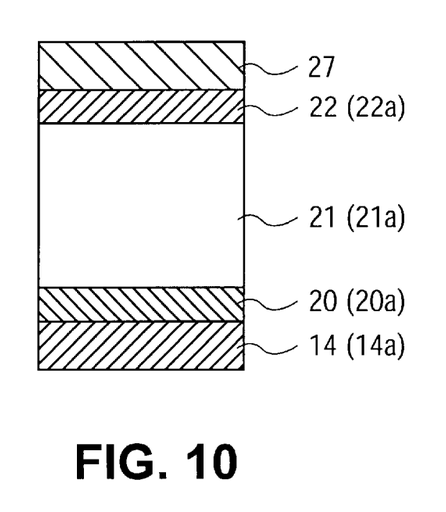
FIG. 10 is a cross-sectional diagram showing a pin photodiode of the preferred embodiment in which intrinsic amorphous silicon is stacked between p-doped and n-doped amorphous silicon layers and the second conductive layer above the photodiode is formed from conductive material which has good light transmissivity.

In the pin photodiode example of FIG. 10, the CMOS metal layer at the bottom is represented as Ti or TiN. Again the material and the thickness will depend on the CMOS process employed to form the top layer 12 of the CMOS circuitry. The n-doped region 20 residing above layer 12 is formed in the range of 400–1000 Angstroms for thin film CMOS processes. The overlying intrinsic region 21 is formed to have a thickness of 4000–12,000 Angstroms. Care must be taken to ensure that the intrinsic region is not too thin (under 4000 angstroms), since higher wavelengths of light are not absorbed as efficiently and sensitivity to red would be diminished.

The next overlying layer is the p-doped layer 22, which is in the thickness range of 100–1000 Angstroms. Care must be taken to ensure that this layer 22 is not too thick, since shorter wavelengths of light are absorbed very close to the silicon surface and photoelectrons generated in the p-region are not collected as efficiently as those generated in the intrinsic region. The subsequent ITO layer 27 is formed having a thickness in the approximate range of 500–1500 Angstroms.

The present invention provides numerous advantages over prior art CMOS image sensors which use lateral integration for the photodiode and the pixel circuitry. For complex image sensors, the fill factor can be much lower than 50% (numbers about 20% are common) because complex sensors typically require more circuitry, which takes up more area and makes the pixel size 30 larger. The present invention allows fill factors close to 100% due to vertical integration of the CMOS control circuitry and the light sensing devices. Vertically integrated CMOS image sensor of the present invention can provide higher sensitivity with the same pixel size or lower cost for the same resolution as CCDs or laterally integrated CMOS sensors. Each pixel can also contain more complex circuitry without the loss of sensitivity. The additional on-chip circuitry that can be incorporated in the present invention can improve the sensor's performance and reduces the size and cost of the sensor.

Another benefit of the present invention is the ability to independently optimize the light sensing devices and the CMOS control circuitry. Laterally integrated CMOS sensors require a compromise between optimum photoelectric and optimum electronic performance since the photodiode and the CMOS circuitry are both fabricated on the same silicon. Due to the vertical integration, the present invention allows independent optimization of the CMOS control circuitry and the light sensing devices since the fabrication of each is separate. The photocurrent is effected by the depletion region volume and is dramatically decreased for smaller CMOS feature sizes. Although the photodiode in a laterally integrated CMOS image sensor is negatively affected by scaling the CMOS circuitry to include additional on-chip functions, the present invention does not suffer from this disadvantage because the light sensing devices and CMOS control circuitry are fabricated on separate layers of the sensor.

Finally, since the present invention uses vertical or three dimensional integration, pixels can be packaged closer together, since their CMOS control circuitry are stacked vertically underneath the photodiodes. Smaller pixel placement results in reduced chip size for a given array, which leads to a significant reduction of manufacturing costs over CCDs and laterally integrated CMOS image sensors.

Also, amorphous silicon is selected for the photodiode material of the present invention, since it has superior optical properties when compared to other materials. The dark current present in an amorphous silicon photodiode is less than 1 nA/cm$^2$ at 300K while the dark current in a crystalline silicon photodiode can range from about 0.1 nA/cm$^2$ to over 1000 nA/cm$^2$ depending on the technology used for the sensor. The dark current is the amount of reverse-bias diode leakage current induced in the photodiode when the photodiode is in the dark (light not impinging). Most dark current in a photodiode is generated in the i-type layer, although, the quality of the n and p contacts could also impact dark current generation. Dark current can cause noise in the signal generated in each pixel in response to the photodiode being exposed to light. Excessive dark current can also reduce the readout dynamic range. Finally, dark current can be damaging to the sensitivity of a photodiode by reducing the sensor's ability to detect as many incident photons as possible. The present invention has reduced the amount of dark current present in the sensor compared to prior art sensors using crystalline photodiodes in CMOS sensors and, thus, has increased the sensitivity of a CMOS image sensor with the same features as a laterally integrated CMOS sensor.

Thus, method and apparatus for fabricating a vertically integrated CMOS image sensor by forming a light sensing device above the surface of CMOS control circuitry has been described. It is appreciated that two embodiments were described above. However, a number of other techniques can be utilized to form a light sensing device vertically above the underlying control circuitry. Furthermore, although the pin photodiode of the preferred embodiment utilizes amorphous silicon having pin photodiode characteristics, other materials and devices can be readily substituted for the light sensing device.

What is claimed is:

1. A method comprising:
   forming a first conductive layer coupled to a circuitry of an integrated circuit device, said first conductive layer disposed above said circuitry;
   forming a light sensing device disposed vertically atop said first conductive layer and above said circuitry, said first conductive layer coupled to one electrical side of said light sensing device;
   forming a first dielectric layer disposed over said light sensing device and having an opening to expose a portion of a top contact layer of said light sensing device; and
   forming a second conductive layer disposed above said light sensing device and coupled to an opposite electrical side of said light sensing device, said second conductive layer coupled to provide a circuit coupling for the circuitry when said light sensing device conducts.

2. The method of claim 1 wherein said light sensing light sensing device is comprised of amorphous silicon.

3. The method of claim 1 wherein said light sensing device is comprised of intrinsic amorphous silicon disposed between n-doped and p-doped amorphous silicon.

4. The method of claim 1 wherein said second conductive layer is comprised of material having optical transmissivity property to allow light to pass through the material to reach the underlying light sensing device.

5. The method of claim 4 wherein said second conductive layer is comprised of indium tin oxide.

6. A method comprising:
   forming a first conductive layer coupled to a complementary metal-oxide-semiconductor (CMOS) circuitry, said first conductive layer disposed above said CMOS circuitry;
   forming a first dielectric layer disposed over said first conductive layer;
   forming an opening in said first dielectric layer to expose a portion of said first conductive layer;
   forming a photodiode disposed vertically atop said first conductive layer and said first dielectric layer, in which a bottom contact layer of the photodiode resides in the opening of said first dielectric layer and contacts said first conductive layer;
   forming a second dielectric layer disposed over said photodiode;
   forming an opening in said second dielectric layer to expose a portion of a top contact layer of said photodiode; and
   forming a second conductive layer disposed above said photodiode and coupled to the top contact layer of said photodiode, said second conductive layer coupled to provide a closed circuit coupling for the circuitry when light is sensed by said photodiode.

7. The method of claim 6 wherein said photodiode is comprised of amorphous silicon.

8. The method of claim 7 wherein said photodiode is fabricated as a p-doped/intrinsic/n-doped, p-i-n, photodiode.

9. The method of claim 8 wherein said photodiode is comprised of intrinsic amorphous silicon disposed between n-doped and p-doped amorphous silicon.

10. The method of claim 6 wherein said second conductive layer is comprised of material having optical transmissivity property which allows light to pass through the material to reach the underlying photodiode.

11. The method of claim 10 wherein said second conductive layer is comprised of indium tin oxide.

12. A method comprising:
   forming a first conductive layer coupled to a complementary metal-oxide-semiconductor (CMOS) circuitry, said first conductive layer disposed above said CMOS circuitry;
   forming a photodiode disposed vertically atop said first conductive layer, said photodiode comprised of an intrinsic material residing between a top and bottom contact layers, in which the bottom contact layer resides atop said first conductive layer;
   forming a first dielectric layer disposed over said photodiode and having an opening to expose a portion of the top contact layer of said photodiode; and forming a second conductive layer disposed above said photodiode and coupled to the top contact layer of said photodiode, said second conductive layer coupled to provide a circuit coupling for the circuitry when light is sensed by said photodiode.

13. The method of claim 12 wherein said photodiode is comprised of amorphous silicon.

14. The method of claim 13 wherein said photodiode is fabricated as a p-doped/intrinsic/n-doped, p-i-n, photodiode.

15. The method of claim 12 wherein said second conductive layer is comprised of material having optical transmissivity property which allows light to pass through the material to reach the underlying photodiode.

16. The method of claim 15 wherein said second conductive layer is comprised of indium tin oxide.

* * * * *